(12) United States Patent
Chen et al.

(10) Patent No.: US 10,651,598 B2
(45) Date of Patent: May 12, 2020

(54) TRANSCEIVER HOT SWAP CONTACT STRUCTURE

(71) Applicant: QUANTA COMPUTER INC., Taoyuan (TW)

(72) Inventors: Chao-Jung Chen, Taoyuan (TW); Yu-Nien Huang, Taoyuan (TW); Kuen-Hsien Wu, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/058,408

(22) Filed: Aug. 8, 2018

(65) Prior Publication Data

US 2019/0296486 A1 Sep. 26, 2019

Related U.S. Application Data

(60) Provisional application No. 62/646,522, filed on Mar. 22, 2018.

(51) Int. Cl.
*H01R 13/631* (2006.01)
*H01R 13/502* (2006.01)
(Continued)

(52) U.S. Cl.
CPC ......... *H01R 13/631* (2013.01); *G02B 6/4261* (2013.01); *G02B 6/4269* (2013.01);
(Continued)

(58) Field of Classification Search
CPC ... H05K 7/20; H05K 7/20454; H05K 7/20154
(Continued)

(56) References Cited

U.S. PATENT DOCUMENTS 5,241,453 A * 8/1993 Bright ................. H01L 23/4093
174/351
6,254,423 B1 * 7/2001 Lin ....................... H01L 23/492
174/16.3
(Continued)

FOREIGN PATENT DOCUMENTS

CN 101608757 A 12/2009
JP S63105847 A 5/1988
(Continued)

OTHER PUBLICATIONS

TW Office Action for Application No. 107137407, dated Apr. 25, 2019, w/First Office Action Summary.
(Continued)

*Primary Examiner* — Tulsidas C Patel
*Assistant Examiner* — Marcus E Harcum
(74) *Attorney, Agent, or Firm* — Nixon Peabody LLP; Zhou Lu

(57) ABSTRACT

A heat transfer system between a heat source and a heat sink, wherein the heat transfer contact surfaces comprise a metal which forms numerous voids when placed adjacent one another. A thermal pad comprising a polymer filled with ceramic particles is placed between these heat transfer surfaces to intimately contact each of the metal surfaces without void formation, thereby increasing thermal conductivity. The heat source and heat sink are joined by relative sliding motion. This sliding motion might damage the thermal pad. Thus, a hot swap structure is provided for controlling the movement of the thermal pad into contact with the heat source as the sliding motion is completed.

15 Claims, 11 Drawing Sheets

(51) Int. Cl.
  *H05K 7/20* (2006.01)
  *G02B 6/42* (2006.01)
  *H04B 5/02* (2006.01)

(52) U.S. Cl.
  CPC ............ *H01R 13/502* (2013.01); *H04B 5/02* (2013.01); *H05K 7/2049* (2013.01); *H05K 7/20336* (2013.01); *H05K 7/20481* (2013.01)

(58) Field of Classification Search
  USPC .................................................. 439/485, 487
  See application file for complete search history.

(56) References Cited

U.S. PATENT DOCUMENTS

| | | | | | |
|---|---|---|---|---|---|
| 6,442,026 | B2* | 8/2002 | Yamaoka | ................... | G06F 1/20 257/719 |
| 6,490,161 | B1* | 12/2002 | Johnson | .............. | H01L 23/4006 361/704 |
| 6,547,580 | B1* | 4/2003 | Leavitt | ................... | H01R 12/88 439/266 |
| 7,230,830 | B2* | 6/2007 | Ujike | ................... | G01R 1/0458 257/718 |
| 7,280,362 | B2* | 10/2007 | Hood | ................. | H01L 23/4093 257/E23.086 |
| 7,641,505 | B2* | 1/2010 | Ma | ..................... | H01L 23/4006 361/711 |
| 8,587,947 | B2* | 11/2013 | Yonemochi | ......... | H01L 23/4093 174/252 |
| 8,885,342 | B2* | 11/2014 | Skepnek | ............... | H01L 23/367 174/548 |
| 2003/0209341 | A1 | 11/2003 | Deboer et al. | | |
| 2009/0266522 | A1 | 10/2009 | Lin et al. | | |
| 2009/0296351 | A1* | 12/2009 | Oki | ...................... | G02B 6/4201 361/709 |
| 2013/0157499 | A1* | 6/2013 | Crippen | ............... | H01R 12/724 439/487 |
| 2013/0210269 | A1* | 8/2013 | Neer | ..................... | G02B 6/4246 439/487 |
| 2014/0092573 | A1* | 4/2014 | Llapitan | ................ | H05K 3/301 361/772 |
| 2014/0170898 | A1* | 6/2014 | Elison | ................ | H05K 7/20454 439/487 |

FOREIGN PATENT DOCUMENTS

| | | |
|---|---|---|
| JP | 2009092748 A | 4/2009 |
| JP | 2009152428 A | 7/2009 |
| TW | 201700942 A | 1/2017 |

OTHER PUBLICATIONS

TW Search Report for Application No. 107137407, dated Apr. 25, 2019, w/First Office Action.

JP Office Action for Application No. 2019-002114, dated Feb. 4, 2020, w/ First Office Action Summary.

* cited by examiner

TRANSCEIVER HOT SWAP CONTACT STRUCTURE

CROSS REFERENCE TO RELATED APPLICATIONS

This application claims priority to and the benefit of U.S. Provisional Patent Application No. 62/646,522, entitled "TRANSCEIVER HOT SWAP CONTACT STRUCTURE" and filed Mar. 22, 2018, the entire contents of which are incorporated by reference as if fully set forth herein.

FIELD

This disclosure relates to the protection of a thermal pad between a heat source and a heat sink where the heat source and heat sink are connected by relative sliding motion. Because of the possibility of damaging the thermal pad during such a connection, a hot swap mechanical structure is employed to prevent damage to the thermal pad when the heat source and heat sink are being joined by relative sliding motion.

BACKGROUND

In traditional designs for switch and other networking systems, a heat source, such as a transceiver, and a heat sink, are joined to provide thermal conduction from the heat source to the heat sink. This is provided by allowing the metal surfaces of the heat source and the heat sink to contact each other for transfer of heat. However, it has been found that this type of contact is imperfect, as the contacting metal surfaces are typically not perfectly flat. Consequently, many portions of the metal surfaces may not be in contact. As a result, tiny gaps exist between the metal surfaces of the heat source and heat sink, and block heat transfer by conduction in these gaps. The existence of these tiny gaps decreases the heat transfer efficiency between the heat source and heat sink. At the same time, newer technologies have increased the heat output at the heat source—up to four times the heat output of previous heat sources. Therefore, there is an ever increasing need to efficiently transfer heat by conduction between the heat source and the heat sink.

In some proposed designs, a thermal pad is included between the heat source and heat sink, allowing more intimate contact with the metal surfaces of both the heat source and heat sink. Such a design aims to avoid the existence of the tiny gaps and increase the efficiency of thermal conduction. However, the efficiency of this design relies on maintaining the thermal pad intact. In some cases, this can be difficult. For example, if the heat source and heat sink are joined by relative sliding motion, there is a tendency for damage to the thermal pad during the sliding motion.

To solve the possibility of damage to the thermal pad, it is a purpose of this disclosure to provide a mechanism to prevent damage to a thermal pad when the heat source and a heat sink with a thermal pad between them are joined by a relative sliding motion.

SUMMARY

It is an object of the present invention to provide a thermal pad between a heat source and a heat sink, which thermal pad is protected, when the heat source and the heat sink are joined by relative motion of these components, such as relative sliding motion, including the provision of a mechanism to prevent protect and prevent damage to the thermal pad during the sliding joinder.

It is also an object of the present invention to provide a hot swap structure to lift the heat sink contact surface above the thermal pad until the travel between the heat sink and the heat source nears its completion, at which time a lever will force the thermal pad and heat sink into intimate contact with the heat source to improve thermal transfer by conduction.

It is also an embodiment of the disclosure to provide wheels to assist the lever to force the heat sink and thermal pad into intimate contact with the heat source to increase contact to improve thermal transfer.

It is a still further embodiment of this disclosure to provide a mechanism which utilizes only a lever structure (without wheels) to cause the heat sink and thermal pad into intimate contact with the heat source to improve heat transfer by conduction.

DETAILED DESCRIPTION

Figure 1:
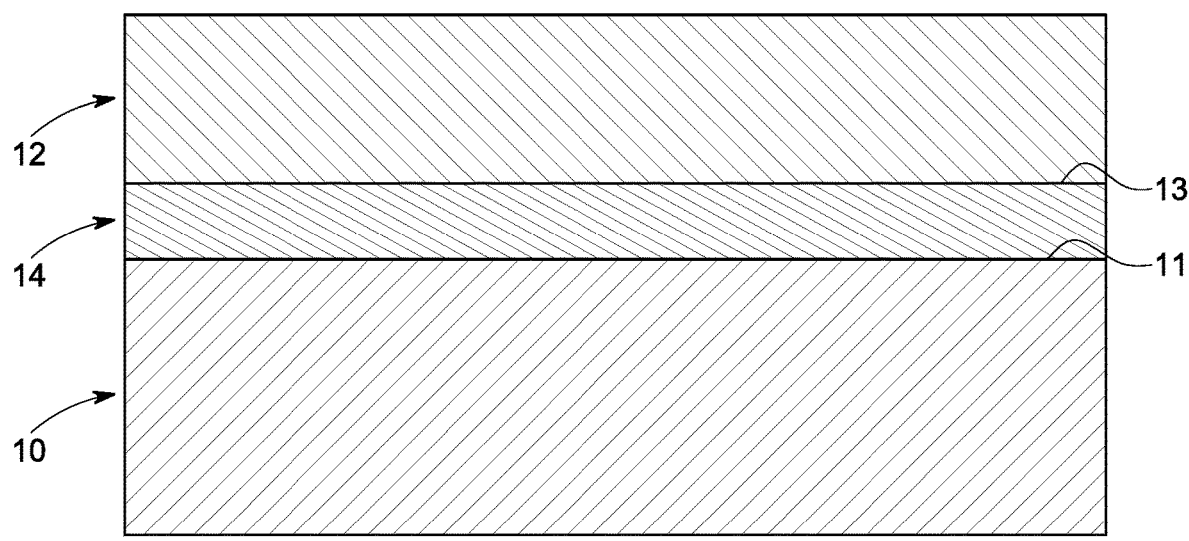
FIG. 1 (Prior Art) is a schematic elevation view of a heat source and a heat sink, with a thermal pad interposed between the heat source and heat sink to improve heat transfer by conduction.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. Those of ordinary skill in the art will appreciate that not every element is visible in every drawing. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, to solve the possibility of damage to the thermal pad, this disclosure describes a hot swap mechanism to protect and prevent damage to a thermal pad when a heat source and a heat sink are joined by a relative sliding motion or other types of damaging motion. This is achieved by the use of the hot swap mechanism, in cooperation with the heat source, the heat sink and the thermal pad. The hot swap mechanism is actuated by contact of the surface of the sliding heat source with a mechanism, including a lever, or a lever and roller, which upon actuation, applies a downward force to bring the thermal pad into contact with the surface of the heat source.

FIG. 1 (Prior Art) illustrates a heat source 10, having a metal surface 11 to transfer heat by conduction to a heat sink 12, also having a metal surface 13. If surfaces 11 and 13 were to be adjacent to one another, imperfections in the surfaces 11 and 13 would result in a plurality of tiny gaps present between surfaces 11 and 13, thereby reducing conductive heat transfer of heat between these surfaces. In order to remedy the defect in having tiny gaps between surfaces 11 and 13, a thermal pad 14, placed between heat source 10 and heat sink 12, has been proposed. This thermal pad 14 intimately contacts each of metal surface 11 and metal surface 13, thus eliminating or reducing the number of gaps and increasing conductive heat transfer between surfaces 11 and 13.

Thermal pad 14 can be made from various materials having both high thermal conductivity and some resiliency to form a soft, conformal thermal pad to intimately contact metal surfaces 11 and 13. For example, thermal pad 14 can be made of a silicone polymer that is combined with a thermal medium, such as ceramic. The silicone polymer and ceramic powders are mixed, cast, and cured to sheet form. Different thermal conductivities can be tailored by selecting both the type of silicone polymer and the type and amount of ceramic powders.

Figure 2:
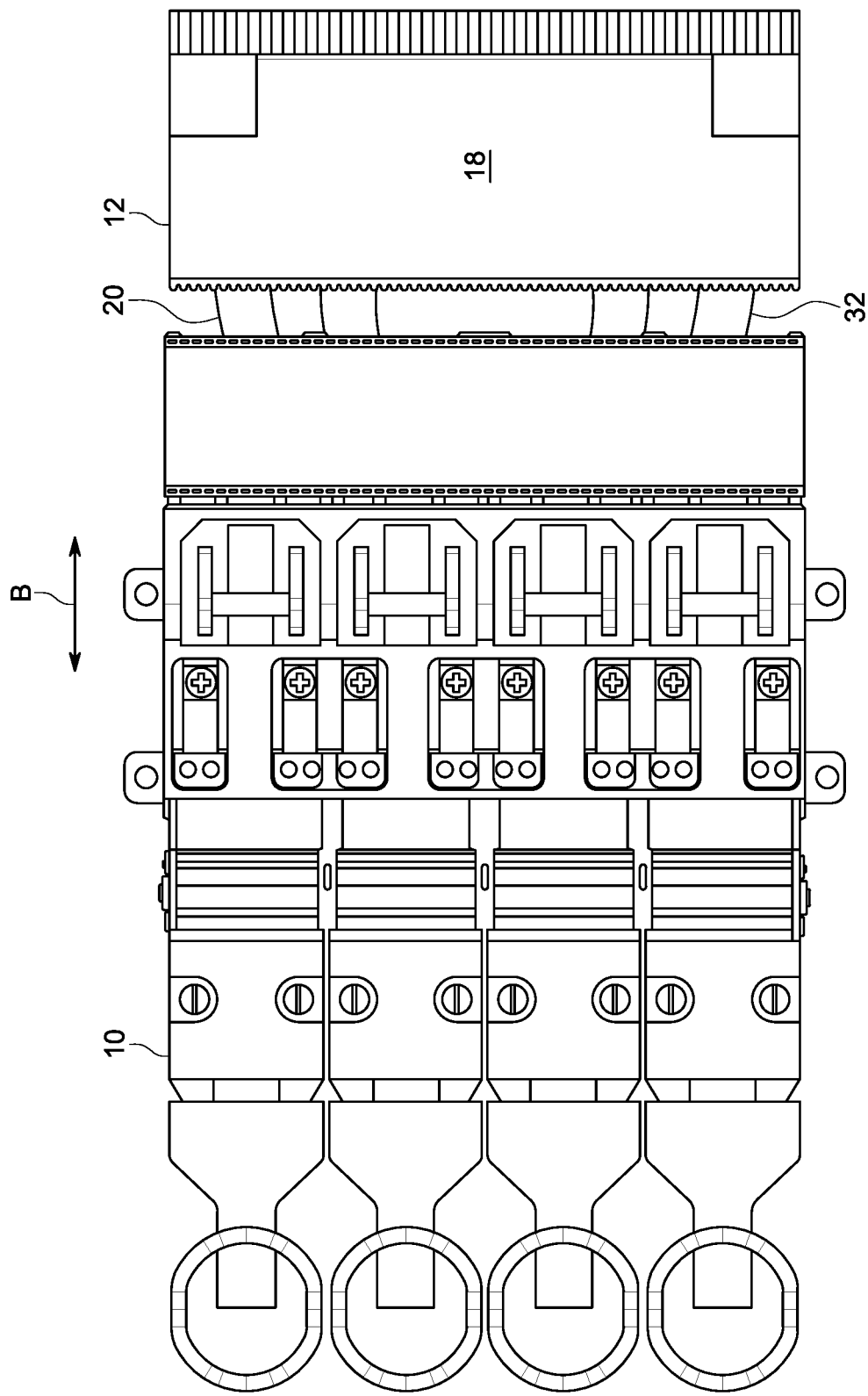
FIG. 2 is a schematic, top view of the heat source and the heat sink after being joined by relative sliding motion.

FIG. 2 is a schematic, top view of the heat source 10 and the heat sink 12 after being joined by relative sliding motion, where the relative sliding motion is in the direction shown by arrow B. heat sink 12, may possess a number of heat pipes 20, 32 to transmit heat between the body 18 of heat sink 12 and a thermal pad 14 interposed between heat source 10 and heat sink 12.

Figure 3:
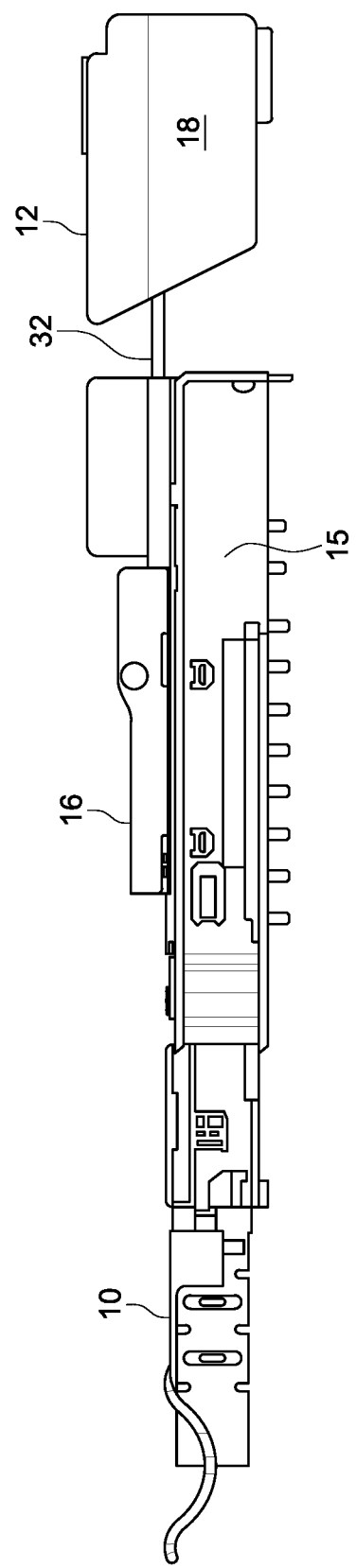
FIG. 3 is a schematic, side view of FIG. 2 illustrating the heat source and heat sink joined after relative sliding motion.

FIG. 3 is a schematic, side view of FIG. 2 illustrating the heat source and heat sink joined after relative sliding motion. As shown in FIGS. 2 and 3, heat sink 12 includes a cage 15 and a hot swap structure 16 above the cage 15, the structure and purpose of which is described further below. Cage 15 assists in the alignment of both vertical and horizontal directions when the heat source 10 and heat sink 12 are joined as shown in FIG. 3 after the relative sliding motion.

Figure 4:
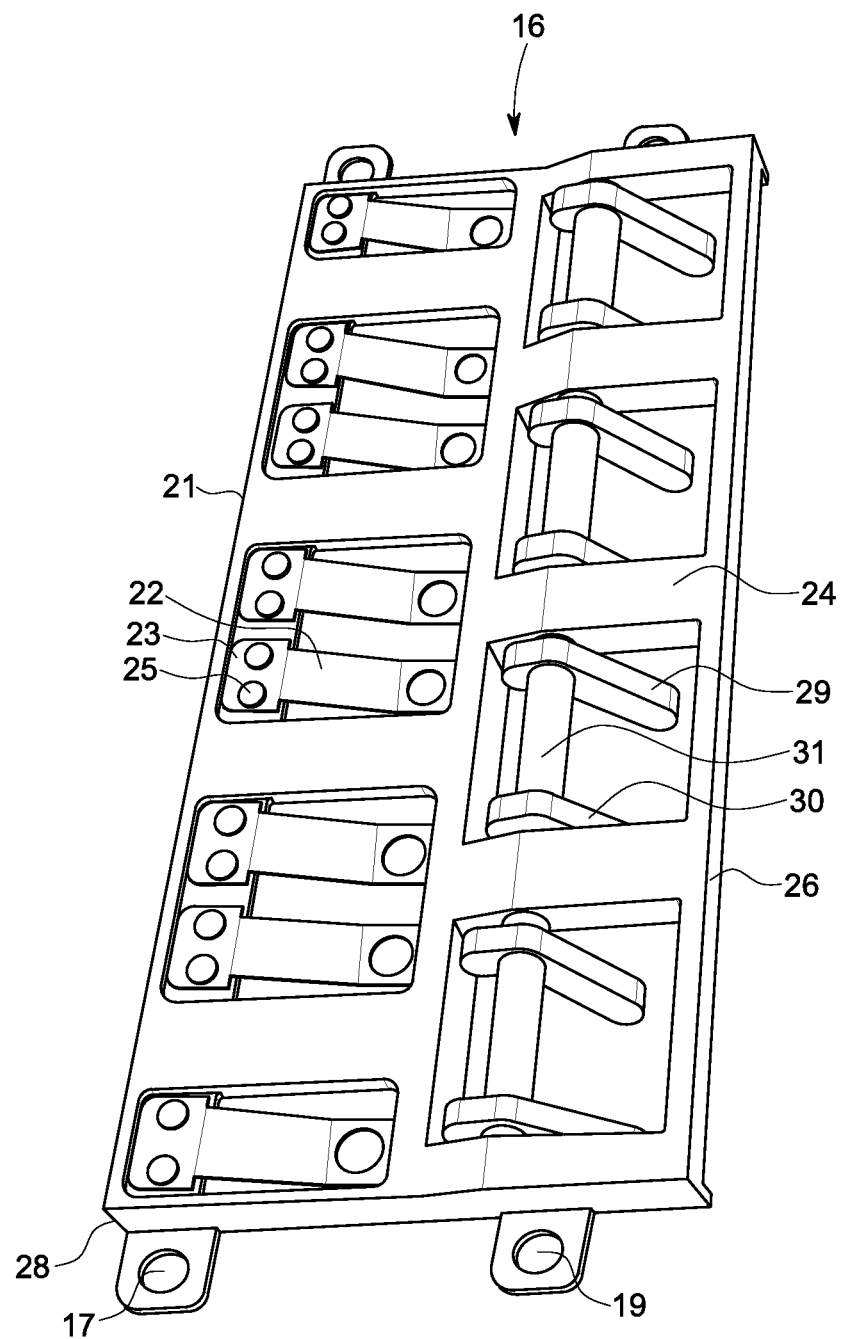
FIG. 4 is a schematic, enlarged perspective view of the hot swap structure of FIG. 2.

FIG. 4 shows, in greater detail, the hot swap mechanism 16. A plurality of mounting holes 17, 19 are provided on the hot swap structure 16 to receive fasteners, such as screws (not shown), to mount the hot swap mechanism to a chassis or tray (not shown). Hot swap structure 16 comprises a framework 24, including a leading edge 21 and a trailing edge 26. Intermediate the leading edge 21 and trailing edge 26 are provided a plurality of metal pieces 22. A forward end 23 of metal piece 22 is in contact with and secured to leading edge 21 by means of fasteners, such as a rivet 25. Leading edge 21 of hot swap structure 16 is chamfered at 28 so as to not impinge upon relatively sliding surfaces during relative movement. A plurality of levers 29, 30 are mounted on a shaft 31 secured to framework 24. Shaft 31 permits a pivoting rotation of each of the plurality of levers 29, 30 as a forward edge of heat source 10 contacts an underside of each of the plurality of levers 29, 30. In its resting (non-contact position with heat source 10) the weight of the levers about the pivot lifts the leading edge 21 away from the thermal pad 14 as to not damage the same when heat source 10 and heat sink 12 are initially moved towards one another in relative sliding motion. However, upon significant movement of the heat sink 12 and heat source 10 towards one another, the heat source 10 comes into contact with the underside of each of the plurality of levers 29, 30, such that the levers 29, 30 of the hot swap structure 16 causes a pivoting motion of each of the plurality of levers 29, 30 permitting each of the metal pieces 22 to force the leading edge 21 and other parts of framework 24 into firm contact with thermal pad 14 and create a gap-free contact for conductive heat transfer between heat source 10 and heat sink 12.

Figure 5:
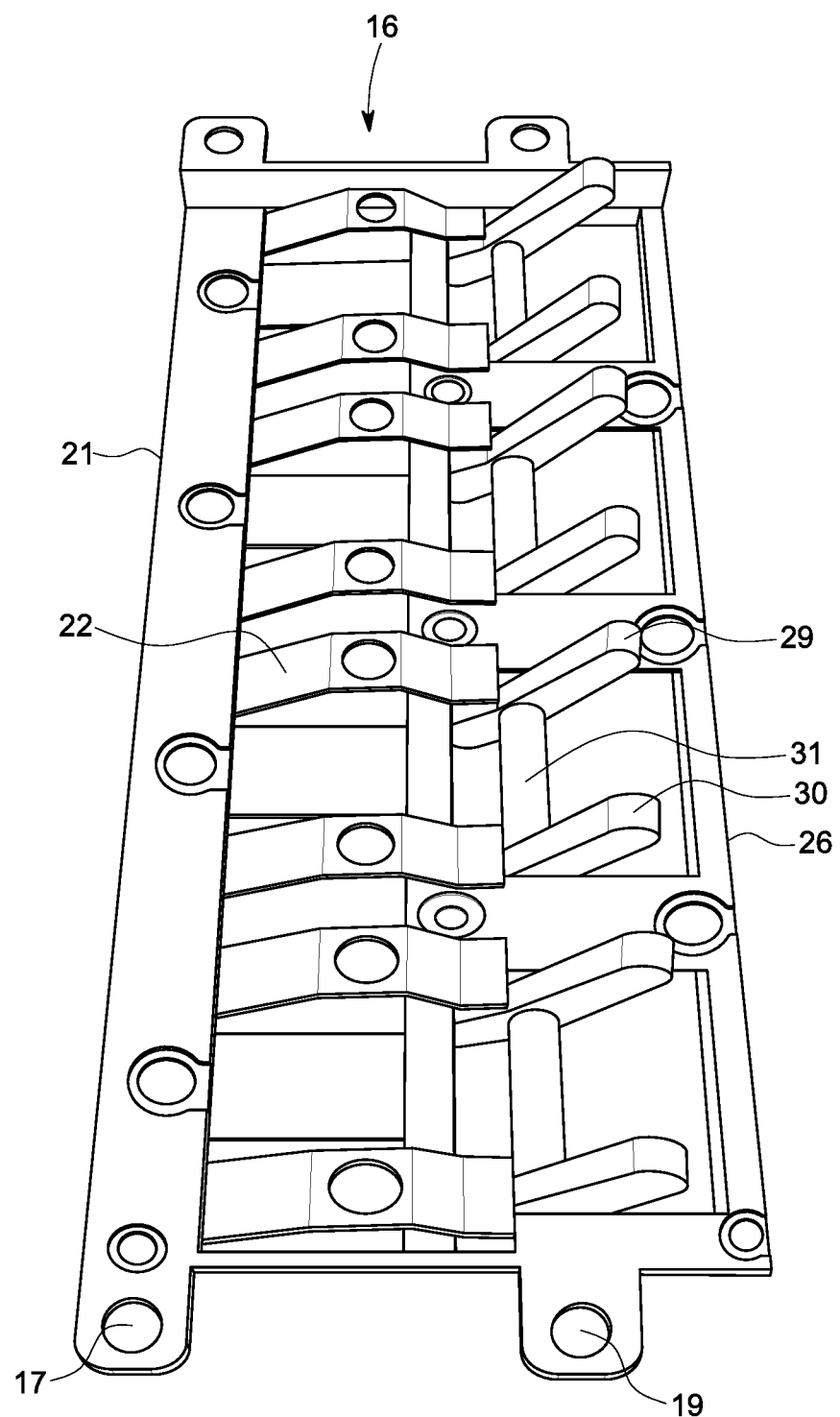
FIG. 5 is a schematic, bottom view of the hot swap structure of FIG. 4.

FIG. 5 is a schematic, bottom of the hot swap structure of FIG. 4 to further illustrate the working structure of the hot swap structure 16. As shown in FIG. 5, the undersides of lever 29, 30 are allowed to contact a leading edge of heat source 10 only after heat source 10 has moved a significant distance towards heat sink 12 and overlies a thermal pad lying beneath the hot swap structure 16. The leading edge 37 of heat sink 12 is chamfered 38 so as not to bind with heat source 10 or thermal pad 14 during initial relative movement. Metal pieces 22, which are in contact with the leading edge 21 of framework 24 provide the force to urge the heat sink 12 towards heat source 10.

Figure 6:
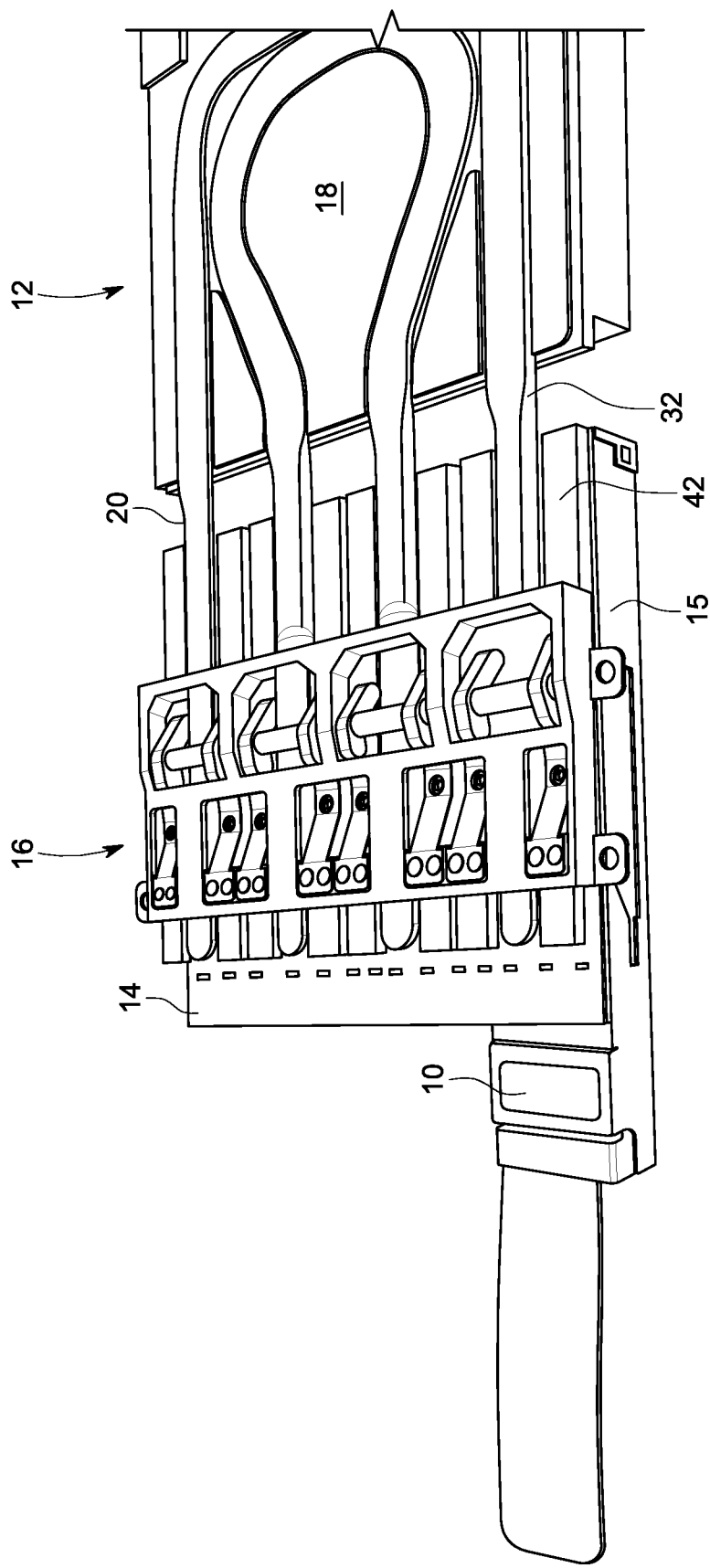
FIG. 6 is an enlarged view of the hot swap structure of FIG. 4 engaged with heat pipes of the heat sink to show detail thereof.

FIG. 6 is an enlarged view of the hot swap structure 16 of FIG. 4 engaged with heat pipes 20, 32 of the heat sink 12 to show detail thereof. Cage 15, clearly visible in FIG. 6 acts as a guide to assure alignment between heat source 10 (only a single unit of which is shown in FIG. 6 for clarity) and heat sink 12 as well as hot swap structure 16. Heat sink 12 can have a forward component 42, directly in contact with heat pipes 20, 32 to assist in the conductive heat transfer between heat source 10 and heat sink 12. Alternatively, forward component 42 can connect directly to body 18 of heat sink 12 to effect the conductive heat transfer.

Figure 7:
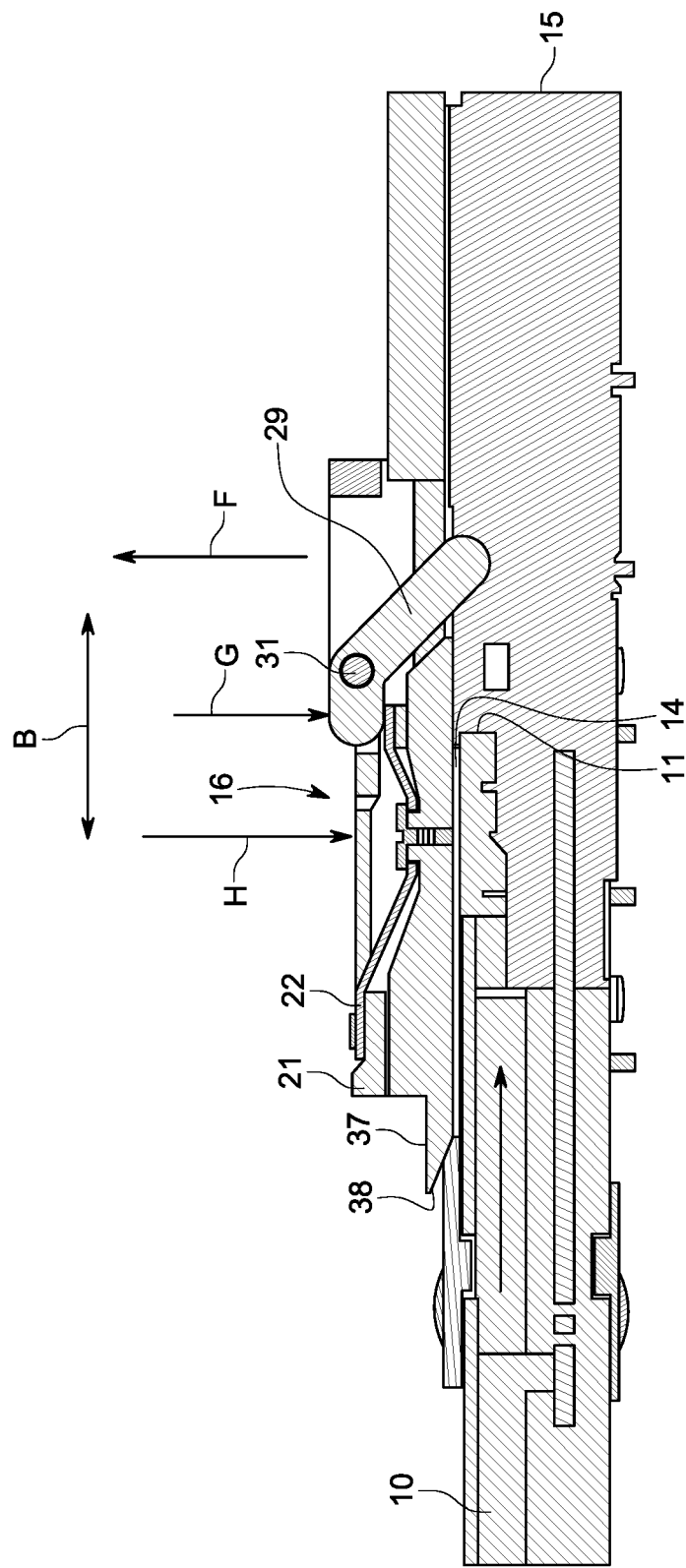
FIG. 7 is an enlarged, schematic view of FIG. 3 to show detail.

FIG. 7 is an enlarged, schematic view of FIG. 3 to show detail. FIG. 7 shows the initial engagement of heat source 10 with heat sink 12, and the interaction of hot swap structure 16 with these elements 10 and 12. When joining heat source 10 with heat sink 12 by relative sliding motion in direction of Arrow B in FIG. 7, lever 29 sits in a void or groove in cage 15 until the upper surface of heat source 10 contacts the lever 29, as shown in FIG. 7. Thermal pad 14 is not pressed against upper surface of heat source 10 at this stage of movement. Upon contact of metal surface 11 with lever 29, lever 29 exhibits an upward force in direction of Arrow F. Lever 29 pivots about shaft 31, causing a downward force in the direction of Arrow G to be applied to trailing edge 26 of metal piece 22. This downward force in the direction of Arrow G applies force upon thermal pad 14 to force it into intimate contact with upper surface of heat source 10. Simultaneously, a downward force in the direction of Arrow H is applied to framework 24. This downward force in direction of Arrow H forces the heat sink 12 into intimate engagement with thermal pad 14 assuring excellent heat conductivity between the upper surface of heat source 10 and heat sink 12, through the intimate contact of each of these surfaces with thermal pad 14.

Figure 8:
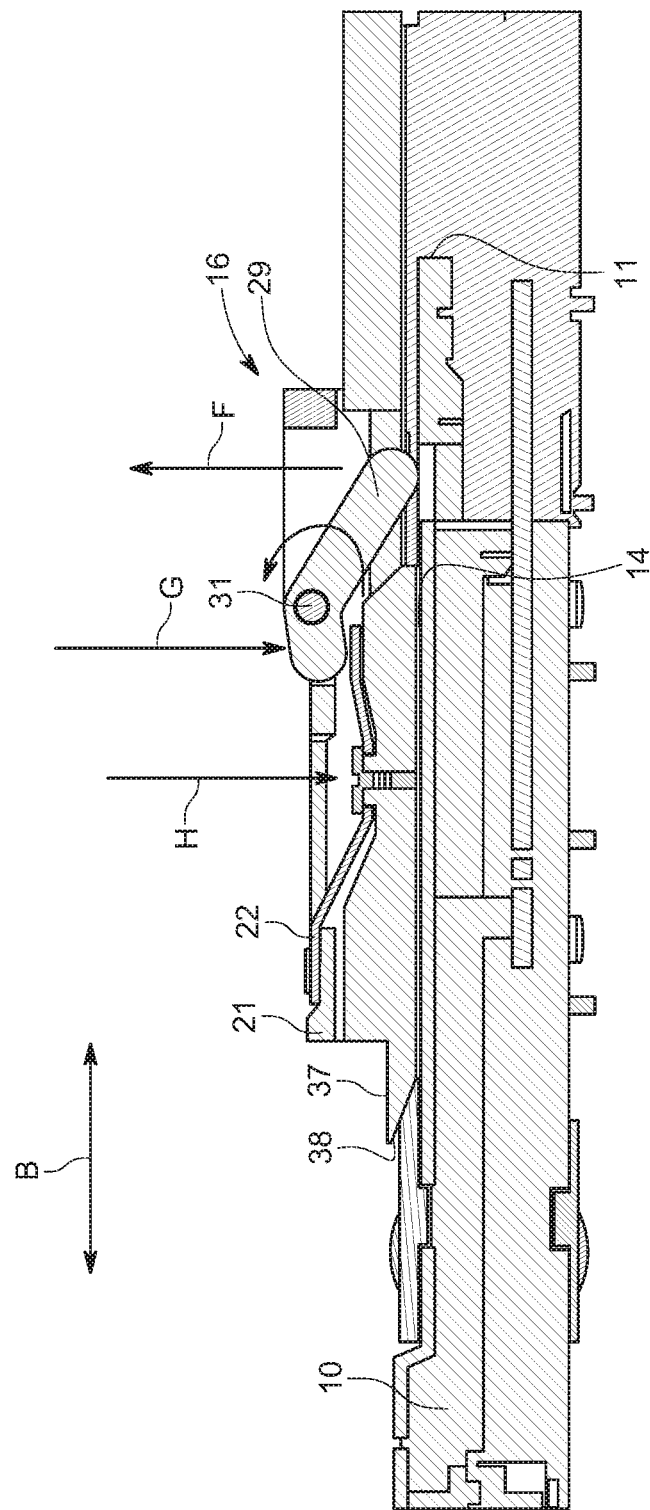
FIG. 8 is a further enlarged view of FIG. 7 to show detail of the forces operating upon the heat contact surface of the heat sink.

FIG. 8 is a further enlarged view of FIG. 7 to show detail of the forces operating upon the heat contact surface of the heat sink 12. In FIG. 8, lever 29 if lifted by its contact with upper surface of heat source 10. This lifting in the direction of arrow F, creates force G, as a result of the pivot of lever 29 about shaft 31, causing one of the plurality of metal pieces 22 to impinge on leading edge 21 of framework 24. Simultaneously, an additional force in the direction of arrow H pushes the bottom of metal pieces 22 into contact with the forward component of heat sink 12 to bring it into direct contact with thermal pad 14 assuring direct conductive transfer between heat source 10 and heat sink 12. Leading edge 37 of heat sink 12 is beveled at 38 so as not to impinge upon thermal pad 14, or any other element, during the relative sliding motion.

Figure 9:
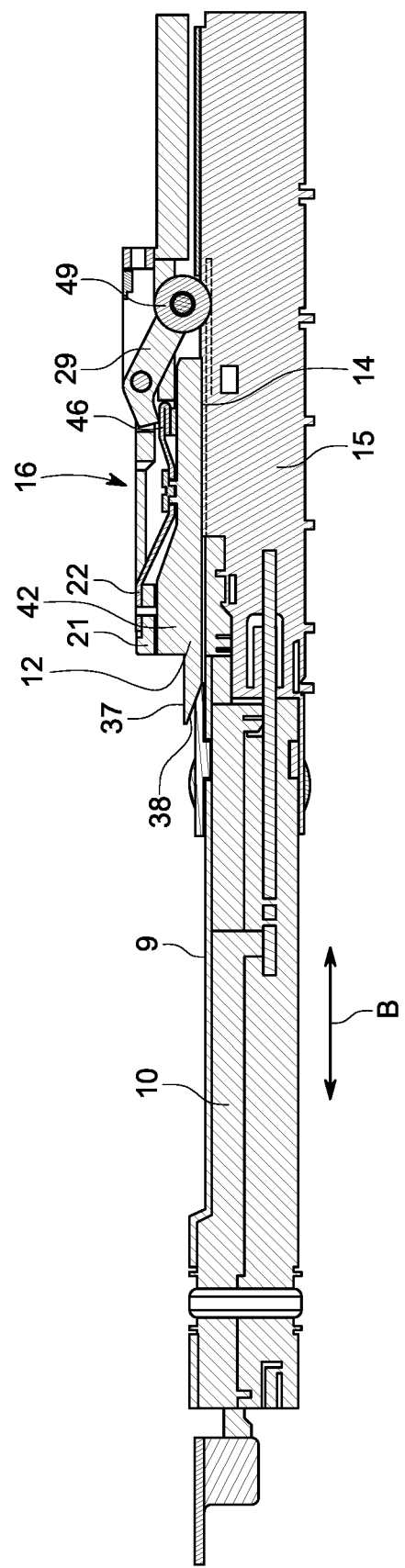
FIG. 9 is a perspective, schematic view of an alternative embodiment of the hot swap structure of FIG. 4.

FIG. 9 is a perspective, schematic view of an alternative embodiment of the hot swap structure of FIG. 4. In FIG. 9, each of the rear edges of the levers 29 are provided with a wheel 49. Wheel 49 rides in a gap or groove in cage 15. Lever 29 rests upon the rear edge 46 of metal piece 22.

Figure 10:
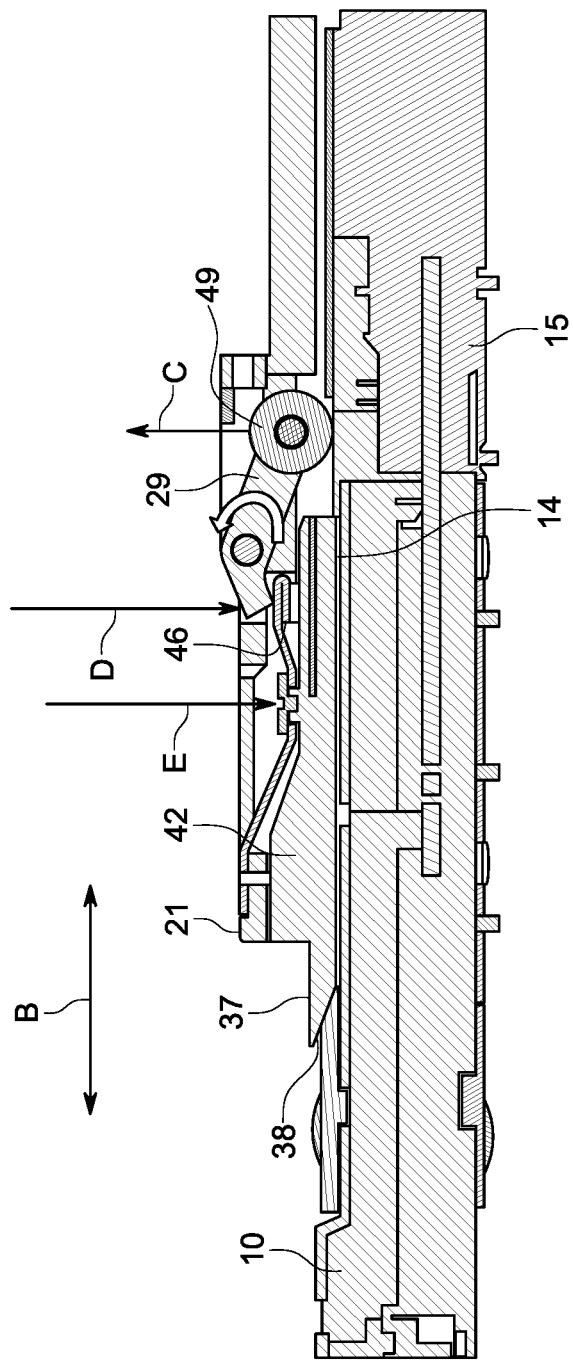
FIG. 10 is an enlarged, cross-sectional view of a joined heat source and heat sink employing the alternative hot swap structure of FIG. 9.

As shown in FIG. 10, as heat source 10 becomes more fully engaged with cage 15 wheel 49 lifts up onto upper surface of heat source 10 in the direction of Arrow C. This lifting in the direction of arrow C causes lever 29 to create a downward force in the direction of Arrow D. This downward force in the direction of Arrow D causes the metal piece 22 to force the leading edge 21 of framework 24 into intimate contact with thermal pad 14 against upper surface of heat source 10. Simultaneously, a downward force in the direction of Arrow E acts upon the framework 24. This downward force against framework 24 acts to bring the forward component 42 of heat sink 12 into contact with thermal pad 14. This contact between component 42 of heat sink 12 and thermal pad 14 assures good thermal conduction between heat source 10 and heat sink 12 through thermal pad 14.

Figure 11:
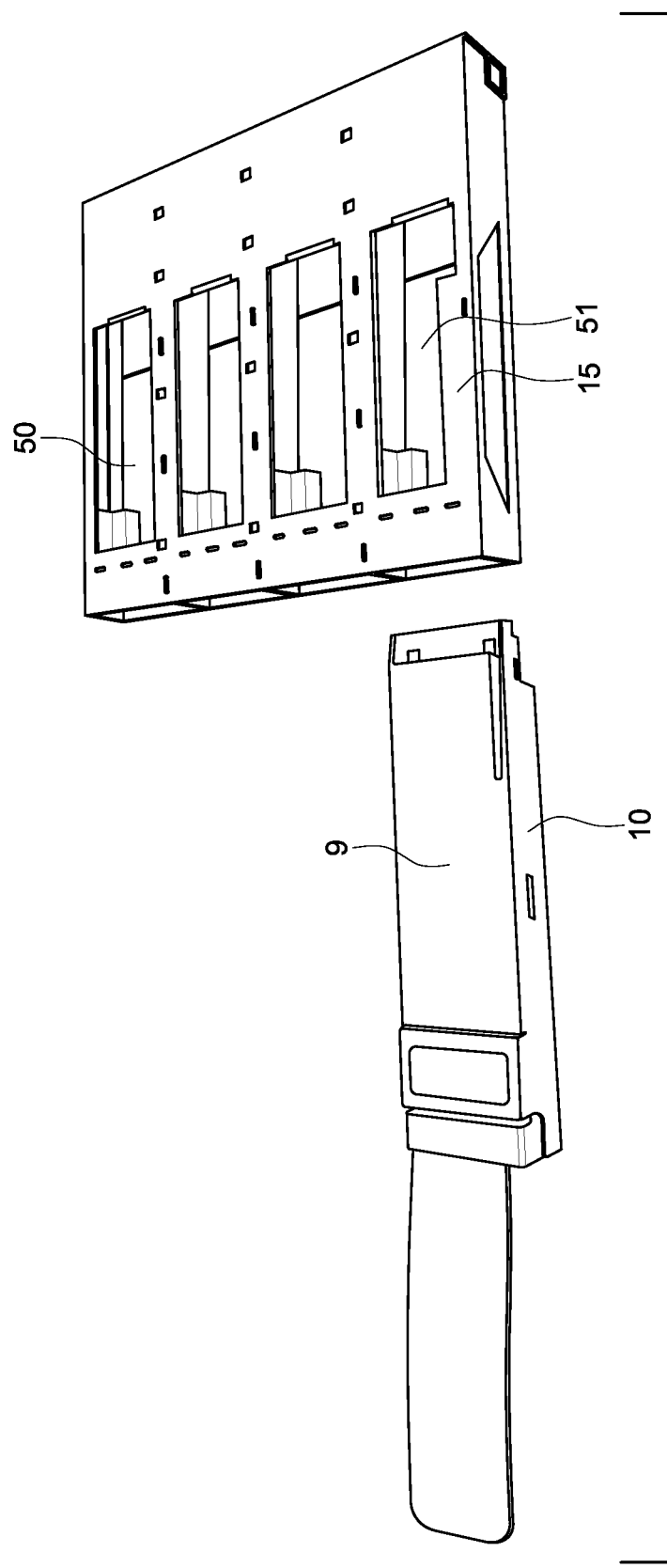
FIG. 11 is an enlarged, partially exploded view of a portion of FIG. 6 to show detail of the heat source 10 and cage 15.

FIG. 11 is an enlarged, partially exploded view of a portion of FIG. 6 to show detail of the heat source 10 and cage 15. Clearly shown are the openings or grooves 50, 51 in cage 15 to permit the levers 29, 30 (or alternatively the wheels 49) to pass through the cage to contact the upper surface 9 of heat source 10.

As heat source 10 can be mentioned transceivers, and similar elements. The sliding motion to join the heat source and heat sink can be in the horizontal direction. Any type of device that has a sliding connection can find benefit from the disclosure herein. Included in such devices are hard disk drives ("HDD") and solid state drives ("SSD").

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A hot swap structure for transferring heat between a heat source and a heat sink comprising:
   a metal piece;
   a lever, the lever being mounted to be operatively engageable with the metal piece;
   a leading edge on the metal piece, and an actuation of the lever also causing the leading edge to exert a force on a framework to cause the framework to urge the heat sink into intimate contact with a thermal pad; and
   the framework for supporting the lever and the metal piece,
   wherein relative sliding motion between the heat source and the heat sink actuates the lever to urge a thermal pad into contact with the heat source.

2. The hot swap structure of claim 1, further comprising a wheel at an end of the lever.

3. The hot swap structure of claim 1, further comprising a cage to guide the heat source and the heat sink during the relative sliding motion.

4. The hot swap structure of claim 3, further comprising a groove or void in the cage in which the lever rests.

5. The hot swap structure of claim 1, wherein the thermal pad comprises a polymer filled with ceramic particles.

6. The hot swap structure of claim 1, wherein the hot swap structure further comprises a plurality of heat sources and a plurality of heat sinks.

7. The hot swap structure of claim 6, wherein a leading edge of each of the hot swap structure is chamfered.

8. A heat transfer system between a heat source and a heat sink comprising:
   a thermal pad between the heat source and the heat sink, wherein the heat source and the heat sink are joined by relative sliding motion; and
   a hot swap structure to urge the thermal pad into contact with the heat source and simultaneously urge the heat sink into contact with the thermal pad the hot swap structure comprising a framework, the framework holding a plurality of metal pieces, the trailing edge of each of the metal pieces in contact with a lever,
   wherein the lever is actuated by contact with the relatively moving heat source,
   wherein the actuation of the lever forces the thermal pad into contact with the heat source,
   wherein the actuation of the lever simultaneously forces the heat sink into contact with the thermal pad.

9. The system of claim 8, wherein each lever has a wheel at its trailing edge.

10. The system of claim 8, further including a cage to align the heat source and heat sink.

11. The heat transfer system of claim 8, wherein the heat source is a transceiver.

12. The system of claim 10, wherein the cage defines a void in which the lever rests until actuated by contact with the relatively moving heat source.

13. The system of claim 8, further comprising a cage, wherein the cage defines a groove in which the wheel rests until actuated by contact with the relatively moving heat source.

14. The system of claim 8, wherein each of the heat transfer surfaces of the heat sink and heat source comprise metal.

15. The system of claim 14, wherein each of the heat transfer surfaces of the heat sink and heat source comprise metal.

\* \* \* \* \*